United States Patent
Kiyono

(10) Patent No.: US 7,609,482 B2
(45) Date of Patent: Oct. 27, 2009

(54) MAGNETIC HEAD SLIDER SUPPORTING DEVICE INCLUDING CONDUCTOR FOR REDUCING CROSSTALK BETWEEN LINES

(75) Inventor: Hiroshi Kiyono, Tokyo (JP)

(73) Assignee: TDK Corporation, Tokyo (JP)

( * ) Notice: Subject to any disclaimer, the term of this patent is extended or adjusted under 35 U.S.C. 154(b) by 535 days.

(21) Appl. No.: 11/186,834

(22) Filed: Jul. 22, 2005

(65) Prior Publication Data

US 2006/0092572 A1 May 4, 2006

(30) Foreign Application Priority Data

Aug. 3, 2004 (JP) ............................. 2004-226281

(51) Int. Cl.
*G11B 5/48* (2006.01)
(52) U.S. Cl. .................... 360/246; 360/128; 360/234.5
(58) Field of Classification Search ................ 360/128, 360/248.8, 245.9, 246, 245.8, 234.5
See application file for complete search history.

(56) References Cited

U.S. PATENT DOCUMENTS

| | | | | |
|---|---|---|---|---|
| 5,422,764 A | * | 6/1995 | McIlvanie | 360/245.8 |
| 5,491,597 A | * | 2/1996 | Bennin et al. | 360/245.9 |
| 5,598,307 A | * | 1/1997 | Bennin | 360/245.9 |
| 5,696,651 A | * | 12/1997 | Endo et al. | 360/245.8 |
| 5,808,834 A | * | 9/1998 | Jurgenson | 360/234.5 |
| 5,835,306 A | * | 11/1998 | Bennin | 360/234.5 |
| 5,844,751 A | * | 12/1998 | Bennin et al. | 360/244.3 |
| 5,914,834 A | * | 6/1999 | Gustafson | 360/245.9 |
| 5,933,293 A | * | 8/1999 | Bennin | 360/245.9 |
| 5,995,329 A | | 11/1999 | Shiraishi et al. | |
| 6,038,102 A | * | 3/2000 | Balakrishnan et al. | 360/264.2 |
| 6,146,813 A | * | 11/2000 | Girard et al. | 360/245.8 |
| 6,512,649 B1 | | 1/2003 | Alini et al. | |
| 6,515,832 B1 | * | 2/2003 | Girard | 360/245.8 |
| 6,801,398 B1 | * | 10/2004 | Ohwe et al. | 360/234.6 |
| 2002/0154454 A1 | * | 10/2002 | Kupinski et al. | 360/245.9 |
| 2003/0053257 A1 | * | 3/2003 | Wada et al. | 360/245.9 |
| 2003/0193753 A1 | | 10/2003 | Arai et al. | |

FOREIGN PATENT DOCUMENTS

| | | |
|---|---|---|
| JP | A 10-300475 | 11/1998 |
| JP | 2001-256627 A | 9/2001 |
| JP | 2002-123903 A | 4/2002 |
| JP | 2003-308668 A | 10/2003 |

* cited by examiner

*Primary Examiner*—Craig A Renner
(74) *Attorney, Agent, or Firm*—Oliff & Berridge, PLC

(57) ABSTRACT

A magnetic head slider supporting apparatus comprises: a suspension flexibly supporting a slider; and a flexible wiring board. The suspension incorporates a load beam. The flexible wiring board is disposed along the load beam. The flexible wiring board includes: first and second lines for connecting a write element that the slider includes to a read/write processing circuit; and third and fourth lines for connecting a read element that the slider includes to the read/write processing circuit. The flexible wiring board further includes two conductors for generating two parasitic capacitances for reducing potential differences created between the third and fourth lines due to write signals transmitted through the first and second lines.

6 Claims, 14 Drawing Sheets

C7=(C1−C2)−(C3−C4)

MAGNETIC HEAD SLIDER SUPPORTING DEVICE INCLUDING CONDUCTOR FOR REDUCING CROSSTALK BETWEEN LINES

BACKGROUND OF THE INVENTION

1. Field of the Invention

The present invention relates to a magnetic head slider supporting apparatus for flexibly supporting a magnetic head slider that faces toward a recording medium, and to a head gimbal assembly, a head arm assembly and a magnetic disk drive each incorporating the magnetic head slider supporting apparatus.

2. Description of the Related Art

A thin-film magnetic head element used in a magnetic disk drive is provided in a magnetic head slider (which may be hereinafter simply called a slider). The slider is flexibly supported by a suspension and placed to face toward a recording medium. When the recording medium rotates, a lift is exerted on the slider because of an airflow passing between the recording medium and the slider. The slider slightly flies over the medium by means of the lift.

The suspension typically incorporates: a plate-spring-shaped load beam; a flexure to which the slider is joined, the flexure being located at an end of the load beam and giving an appropriate degree of freedom to the slider; and a mounting section provided at the other end of the load beam and attached to an arm for moving the slider across the tracks of the recording medium. An assembly in which the slider is attached to the suspension is called a head gimbal assembly. An assembly in which the head gimbal assembly is attached to a single arm is called a head arm assembly.

A thin-film magnetic head element incorporates a write element for writing data on a recording medium and a read element for reading data from the recording medium. A magnetic disk drive comprises a read/write processing circuit for controlling the write element and the read element. The write element is connected to the read/write processing circuit through two lines while the read element is connected to the read/write processing circuit through another two lines. These four lines in total are located in proximity to one another along the load beam of the suspension. As a result, there is a possibility that parasitic capacitances emerge among these lines and that crosstalk occurs between each of the lines connected to the write element and each of the lines connected to the read element.

If the above-mentioned crosstalk occurs, a relatively large voltage is induced on the lines connected to the read element in response to a great change in voltage of a write signal, and this voltage is applied to the read element. As a result, such a problem arises that electromigration at the read element is accelerated to cause a reduction in the life of the read element and that diffusion of atoms among layers making up the read element is accelerated to cause degradation in the characteristics of the read element. This problem has become particularly noticeable as higher recording density is achieved for magnetic disk drives recently. One of the reasons is that thin-film magnetic head elements are reduced in dimensions as higher recording density is achieved, and the area of a region in which the read element is disposed is reduced and the heat releasing property is thereby reduced, and that the cross-sectional area of the read element is reduced and the current density in the read element is thereby increased. Another one of the reasons is that the frequency of a write signal is increased as higher recording density is achieved, and a change in voltage of the write signal is thereby made abrupt.

According to a technique disclosed in the Published Unexamined Japanese Patent Application 2001-256627, in a head gimbal assembly incorporating a slider, a suspension and lead traces, a parasitic capacitance between the ground and the lead traces is reduced by removing a portion of a load beam and a portion of a flexure located below the lead traces.

The Published Unexamined Japanese Patent Application 2003-308668 discloses a technique in which, in a wiring member used for a suspension, the thickness of a polyimide layer between a metal substrate and conductors is changed and the widths of the conductors are changed, so that the distance between the conductors is increased to reduce crosstalk.

The Published Unexamined Japanese Patent Application 2002-123903 discloses a technique for suppressing crosstalk by applying voltages having nearly symmetric waveforms to two lines connected to a write element.

According to the technique disclosed in the Published Unexamined Japanese Patent Application 2001-256627, it is impossible to reduce a parasitic capacitance between the lines. It is therefore impossible to reduce crosstalk between the lines.

According to the technique disclosed in the Published Unexamined Japanese Patent Application 2003-308668, there is a limit to the distance between the conductors that can be increased. It is therefore difficult to reduce crosstalk effectively.

According to the technique disclosed in the Published Unexamined Japanese Patent Application 2002-123903, it is intended to cancel out voltages wherein one of the voltages is induced on two lines connected to the read element by a voltage spike emerging on one of the lines connected to the write element while the other of the voltages is induced on the two lines connected to the read element by a voltage spike emerging on the other of the lines connected to the write element. In practice, however, there is a difference between the distance from the one of the lines connected to the write element to the two lines connected to the read element and the distance from the other of the lines connected to the write element to the two lines connected to the read element. Consequently, the voltages induced on the two lines connected to the read element by the voltage spikes emerging on the two lines connected to the write element are not equal. Therefore, crosstalk still occurs, according to the technique disclosed in the Published Unexamined Japanese Patent Application 2002-123903.

OBJECT AND SUMMARY OF THE INVENTION

It is an object of the invention to provide a magnetic head slider supporting apparatus capable of reducing crosstalk between a line connected to a write element and a line connected to a read element, and to a head gimbal assembly, a head arm assembly and a magnetic disk drive each incorporating the magnetic head slider supporting apparatus.

A magnetic head slider supporting apparatus of the invention comprises: a suspension flexibly supporting a magnetic head slider incorporating a write element and a read element, such that the slider faces toward a recording medium; a first line and a second line that are connected to the write element and transmit write signals to be applied to the write element; and a third line and a fourth line that are connected to the read element and transmit read signals outputted from the read element. The suspension incorporates a plate-spring-shaped load beam. The first to fourth lines include portions disposed along the load beam. The supporting apparatus of the invention further comprises, in addition to the first to fourth lines, a conductor generating a parasitic capacitance for reducing a potential difference created between the third and fourth lines due to the write signals transmitted through the first and second lines.

In the magnetic head slider supporting apparatus of the invention, the conductor provided in addition to the first to fourth lines generates a parasitic capacitance for reducing a potential difference created between the third and fourth lines due to the write signals transmitted through the first and second lines.

In the magnetic head slider supporting apparatus of the invention, the portions of the first to fourth lines disposed along the load beam may be located side by side in the order of the first line, the second line, the third line and the fourth line. In addition, the supporting apparatus may comprise as the conductor a first conductor for generating a first parasitic capacitance between the second and fourth lines and a second conductor for generating a second parasitic capacitance between the first and fourth lines.

In the above-mentioned configuration, equations $C5=C1-C3$ and $C6=C2-C4$ may hold, where: $C1$ is a parasitic capacitance between the second and third lines; $C2$ is a parasitic capacitance between the first and third lines; $C3$ is a parasitic capacitance between the second and fourth lines excluding the first parasitic capacitance; $C4$ is a parasitic capacitance between the first and fourth lines excluding the second parasitic capacitance; $C5$ is the first parasitic capacitance; and $C6$ is the second parasitic capacitance. Furthermore, the first conductor may be connected to the fourth line and disposed adjacent to the second line with a space, and the second conductor may be connected to the fourth line and disposed adjacent to the first line with a space.

In the magnetic head slider supporting apparatus of the invention, the portions of the first to fourth lines disposed along the load beam may be located side by side in the order of the first line, the second line, the third line and the fourth line, and the conductor may generate a parasitic capacitance between the first and third lines.

In the above-mentioned configuration, an equation $C7=(C1-C2)-(C3-C4)$ may hold, where: $C1$ is a parasitic capacitance between the second and third lines; $C2$ is a parasitic capacitance between the first and third lines excluding the parasitic capacitance generated by the conductor; $C3$ is a parasitic capacitance between the second and fourth lines; $C4$ is a parasitic capacitance between the first and fourth lines; and $C7$ is the parasitic capacitance generated by the conductor. Furthermore, the conductor may be connected to the third line and disposed adjacent to the first line with a space.

In the magnetic head slider supporting apparatus of the invention, the portions of the first to fourth lines disposed along the load beam may be located side by side in the order of the first line, the second line, the third line and the fourth line, and the conductor may generate a parasitic capacitance between the second and fourth lines.

In the above-mentioned configuration, an equation $C8=(C1-C2)-(C3-C4)$ may hold, where: $C1$ is a parasitic capacitance between the second and third lines; $C2$ is a parasitic capacitance between the first and third lines; $C3$ is a parasitic capacitance between the second and fourth lines excluding the parasitic capacitance generated by the conductor; $C4$ is a parasitic capacitance between the first and fourth lines; and $C8$ is the parasitic capacitance generated by the conductor. Furthermore, the conductor may be connected to the fourth line and disposed adjacent to the second line with a space.

A head gimbal assembly of the invention comprises: a magnetic head slider incorporating a write element and a read element; and the magnetic head slider supporting apparatus of the invention.

A head arm assembly of the invention comprises: a magnetic head slider incorporating a write element and a read element; the magnetic head slider supporting apparatus of the invention; and an arm for moving the magnetic head slider across tracks of a recording medium, wherein the suspension incorporated in the supporting apparatus is attached to the arm.

A magnetic disk drive of the invention comprises: a magnetic head slider incorporating a write element and a read element; the magnetic head slider supporting apparatus of the invention; an alignment device for moving the supporting apparatus and thereby aligning the magnetic head slider with respect to a recording medium; and a read/write processing circuit for applying the write signals to the write element through the first and second lines incorporated in the supporting apparatus and receiving the read signals from the read element through the third and fourth lines incorporated in the supporting apparatus.

In the magnetic disk drive of the invention, the read/write processing circuit may apply voltages of asymmetric waveforms as the write signals to the first and second lines.

In the magnetic disk drive of the invention, the read/write processing circuit may apply voltages of substantially symmetric waveforms as the write signals to the first and second lines. The substantially symmetric waveforms include a case in which the difference in amplitude of both waveforms is equal to or smaller than 10 percent of the amplitude of one of the waveforms.

In the magnetic head slider supporting apparatus, the head gimbal assembly, the head arm assembly, or the magnetic disk drive of the invention, the conductor provided in addition to the first to fourth lines generates a parasitic capacitance for reducing a potential difference created between the third and fourth lines due to the write signals transmitted through the first and second lines. According to the invention, it is thereby possible to reduce crosstalk between the line connected to the write element and the line connected to the read element.

Other and further objects, features and advantages of the invention will appear more fully from the following description.

DETAILED DESCRIPTION OF THE PREFERRED EMBODIMENTS

First Embodiment

Figure 5:
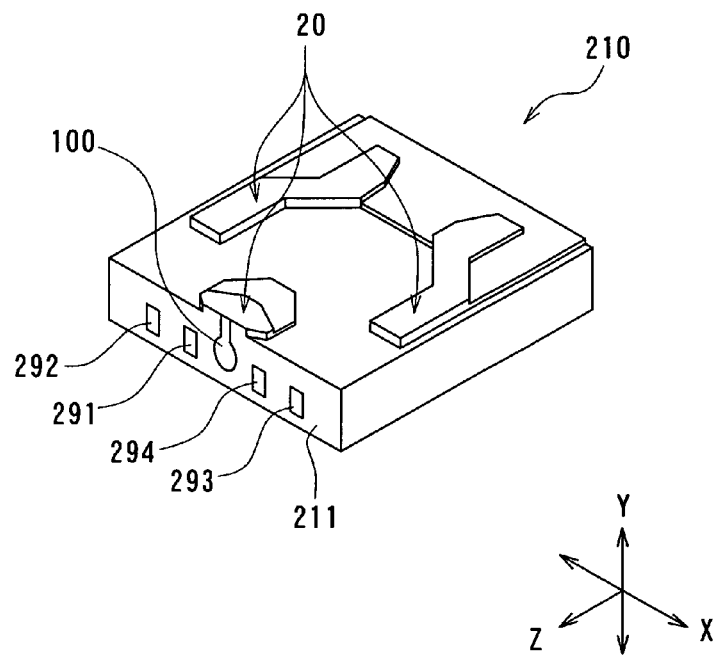
FIG. 5 is a perspective view illustrating a slider that a head gimbal assembly of the first embodiment of the invention includes.

Preferred embodiments of the invention will now be described in detail with reference to the accompanying drawings. Reference is now made to FIG. 5 to describe a magnetic head slider (hereinafter simply called a slider) incorporated in a head gimbal assembly of a first embodiment of the invention. In a magnetic disk drive of the embodiment the slider 210 is placed to face toward a circular-plate-shaped recording medium to be rotated and driven. The slider 210 has a base body 211. The base body 211 is nearly hexahedron-shaped. One of the six surfaces of the base body 211 faces toward the recording medium. An air bearing surface 20 is formed in this one of the surfaces. When the recording medium rotates in the Z direction of FIG. 5, an airflow passes between the recording medium and the slider 210 and a lift is thereby generated below the slider 210 in the Y direction of FIG. 5 and exerted on the slider 210. The slider 210 flies over the recording medium by means of the lift. The X direction of FIG. 5 is across the tracks of the recording medium. A thin-film magnetic head element 100 is provided near the air-outflow-side end (the end located at the lower left of FIG. 5) of the base body 211 and near the air bearing surface 20. Four terminals 291, 292, 293 and 294 are provided in the air-outflow-side surface of the base body 211.

Figure 6:
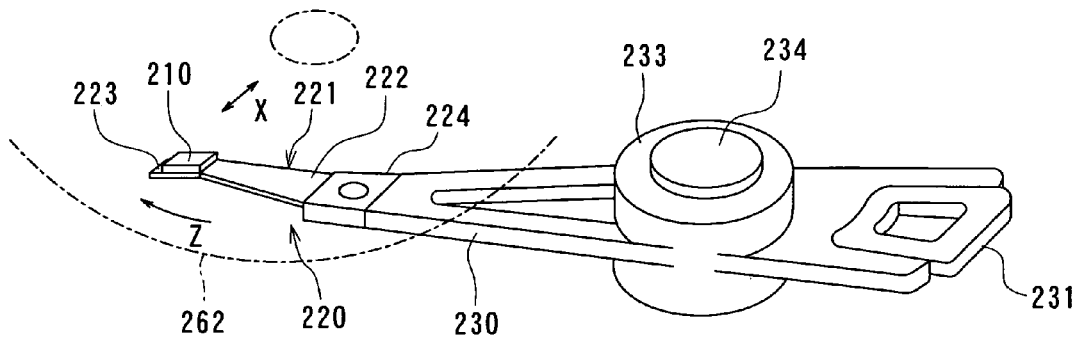
FIG. 6 is a perspective view illustrating a head arm assembly of the first embodiment of the invention.

Reference is now made to FIG. 6 to describe the head gimbal assembly 220 of the embodiment. The head gimbal assembly 220 comprises the slider 210 and a suspension 221 that flexibly supports the slider 210 such that the slider 210 faces toward a recording medium 262. The suspension 221 incorporates: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. A gimbal section for maintaining the orientation of the slider 210 is provided in a portion of the flexure 223 to which the slider 210 is attached. The base plate 224 is designed to be attached to an arm 230 of an actuator for moving the slider 210 along the X direction across the tracks of the recording medium 262. The actuator incorporates the arm 230 and a voice coil motor that drives the arm 230. The actuator corresponds to the alignment device of the invention and aligns the slider 210 with respect to the recording medium 262 by moving the head gimbal assembly 220.

An assembly comprising the arm 230 and the head gimbal assembly 220 attached to the arm 230 is called a head arm assembly. An assembly comprising a carriage having a plurality of arms wherein the head gimbal assembly 220 is attached to each of the arms is called a head stack assembly.

FIG. 6 illustrates an example of the head arm assembly. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to an axis 234 that rotatably supports the arm 230.

Figure 7:
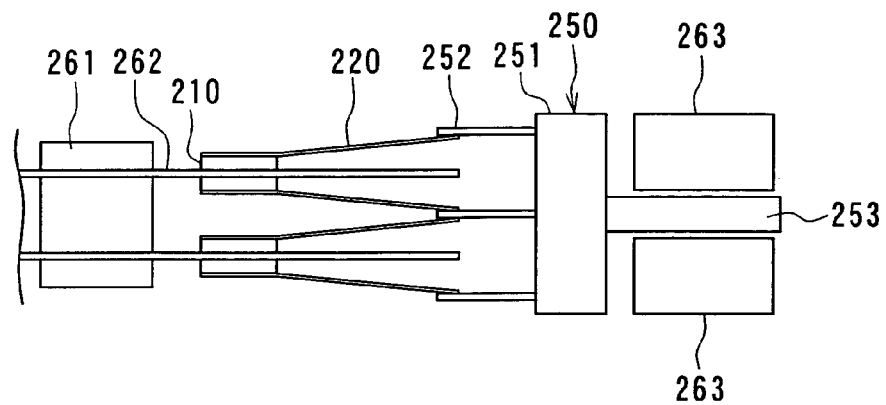
FIG. 7 is a view for illustrating a main part of a magnetic disk drive of the first embodiment of the invention.
Figure 8:
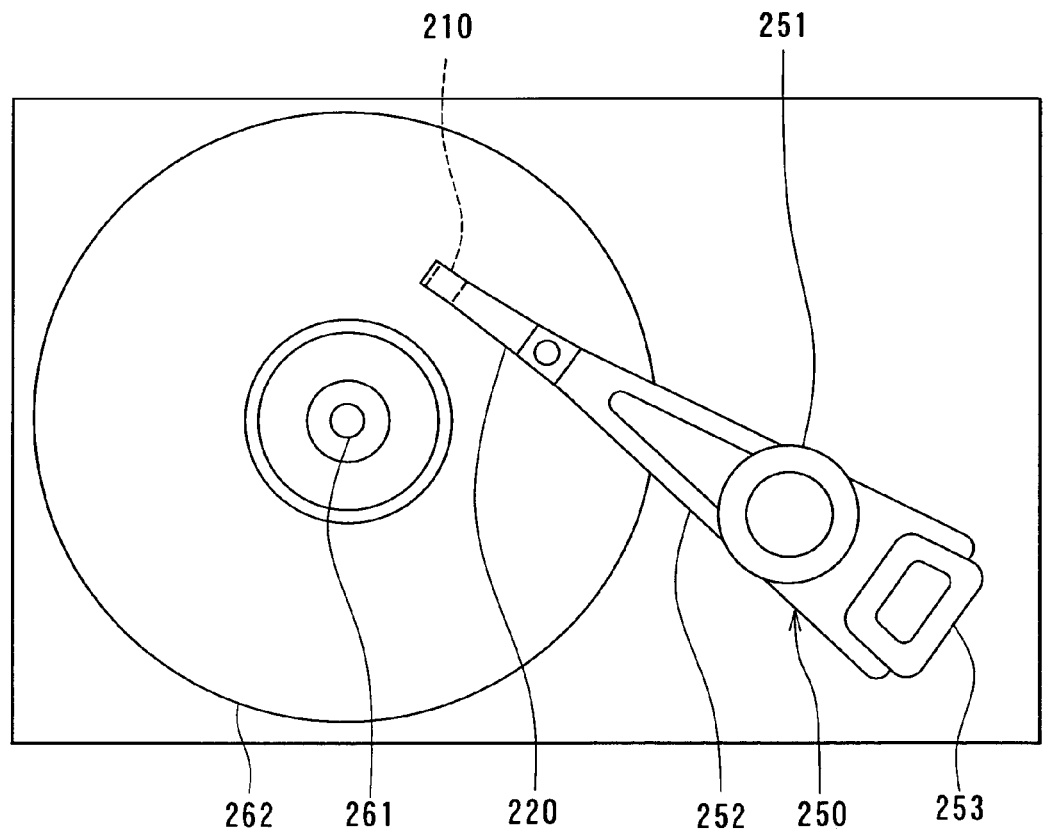
FIG. 8 is a top view of the magnetic disk drive of the first embodiment of the invention.

Reference is now made to FIG. 7 and FIG. 8 to describe an example of the head stack assembly and the magnetic disk drive of the embodiment. FIG. 7 illustrates the main part of the magnetic disk drive. FIG. 8 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the magnetic disk drive. The magnetic disk drive includes a plurality of recording media 262 mounted on a spindle motor 261. Two of the sliders 210 are allocated to each of the media 262, such that the two sliders 210 are opposed to each other with each of the media 262 disposed in between. The voice coil motor includes permanent magnets 263 disposed to be opposed to each other, the coil 253 of the head stack assembly 250 being placed between the magnets 263. The carriage 251 and the voice coil motor make up the actuator. The actuator corresponds to the alignment device of the invention and aligns the sliders 210 with respect to the recording media 262 by moving the head gimbal assembly 220.

In the magnetic disk drive of the embodiment, the actuator moves the slider 210 across the tracks of the recording medium 262 and aligns the slider 210 with respect to the recording medium 262. The thin-film magnetic head element incorporated in the slider 210 writes data on the recording medium 262 through the use of the write element and reads data stored on the recording medium 262 through the use of the read element.

The magnetic disk drive may comprise the head arm assembly shown in FIG. 5 in place of the head stack assembly 250.

The magnetic head slider supporting apparatus of the embodiment comprises the suspension 221 and lines and conductors described later. The head gimbal assembly, the head arm assembly, and the magnetic disk drive of the embodiment each incorporate these lines and conductors, too. Detailed descriptions of the lines and conductors will be given later.

Figure 9:
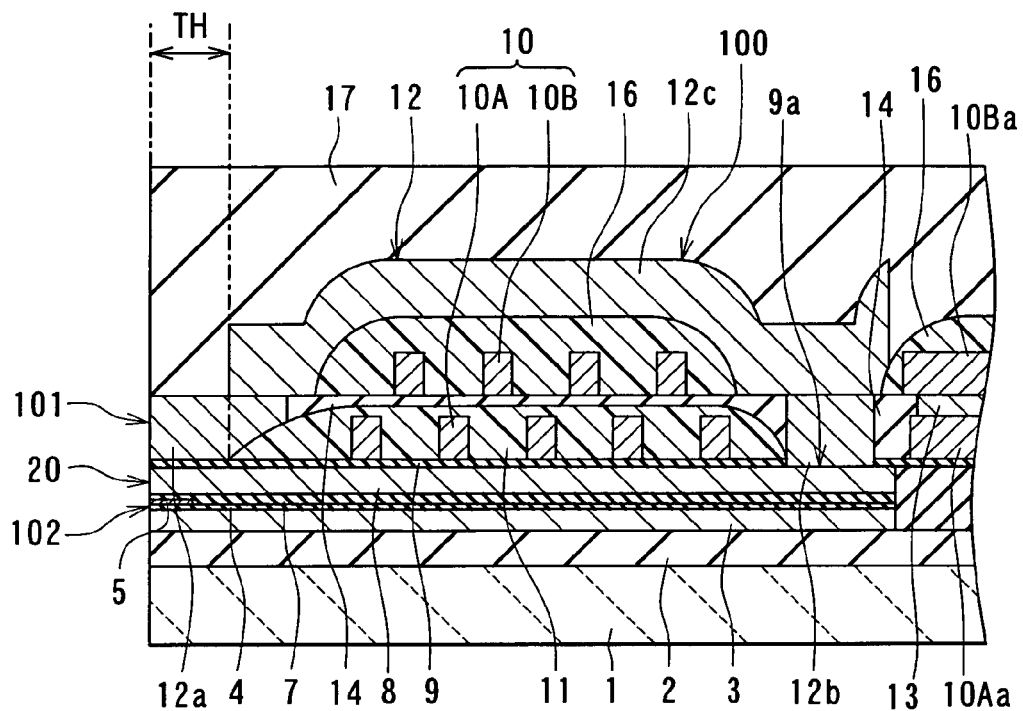
FIG. 9 is a cross-sectional view of the thin-film magnetic head element of the first embodiment of the invention, wherein the cross section is orthogonal to the air bearing surface and the substrate.
Figure 10:
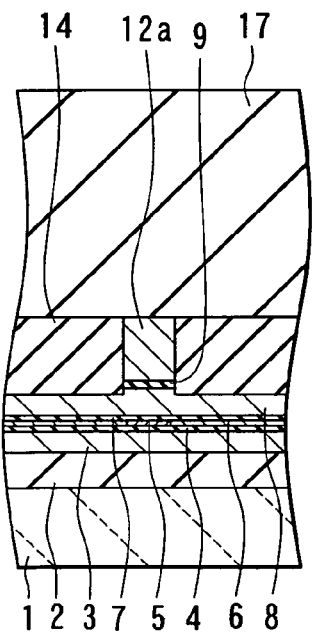
FIG. 10 is a cross-sectional view of a pole portion of the thin-film magnetic head element of the first embodiment of the invention, wherein the cross section is parallel to the air bearing surface.

Reference is now made to FIG. 9 and FIG. 10 to describe the configuration and manufacturing method of the thin-film magnetic head element 100 incorporated in the slider 210. FIG. 9 is a cross-sectional view of the thin-film magnetic head element 100, wherein the cross section is orthogonal to the air bearing surface and the substrate. FIG. 10 is a cross-sectional view of the pole portion of the thin-film magnetic head element 100, wherein the cross section is parallel to the air bearing surface.

In the method of manufacturing the thin-film magnetic head element 100, first, an insulating layer 2 made of an insulating material such as alumina ($Al_2O_3$) and having a thickness of 1 to 5 μm, for example, is formed by a method such as sputtering on a substrate 1 made of a ceramic such as aluminum oxide and titanium carbide ($Al_2O_3 \cdot TiC$). Next, a bottom shield layer 3 for the read element made of a magnetic material such as Permalloy (NiFe) and having a thickness of approximately 3 μm, for example, is formed on the insulating layer 2 by a method such as sputtering or plating.

Next, a bottom shield gap film 4 made of an insulating material and having a thickness of 10 to 200 nm, for example, is formed on the bottom shield layer 3 by a method such as sputtering. Next, a magnetoresistive (MR) element 5 for reading, a pair of bias field applying layers not shown and a pair of electrode layers 6 each of which has a thickness of tens of nanometers are formed on the bottom shield gap film 4. Next, a top shield gap film 7 made of an insulating material and having a thickness of 10 to 200 nm, for example, is formed on the bottom shield gap film 4 and the MR element 5 by a method such as sputtering.

Figure 23:
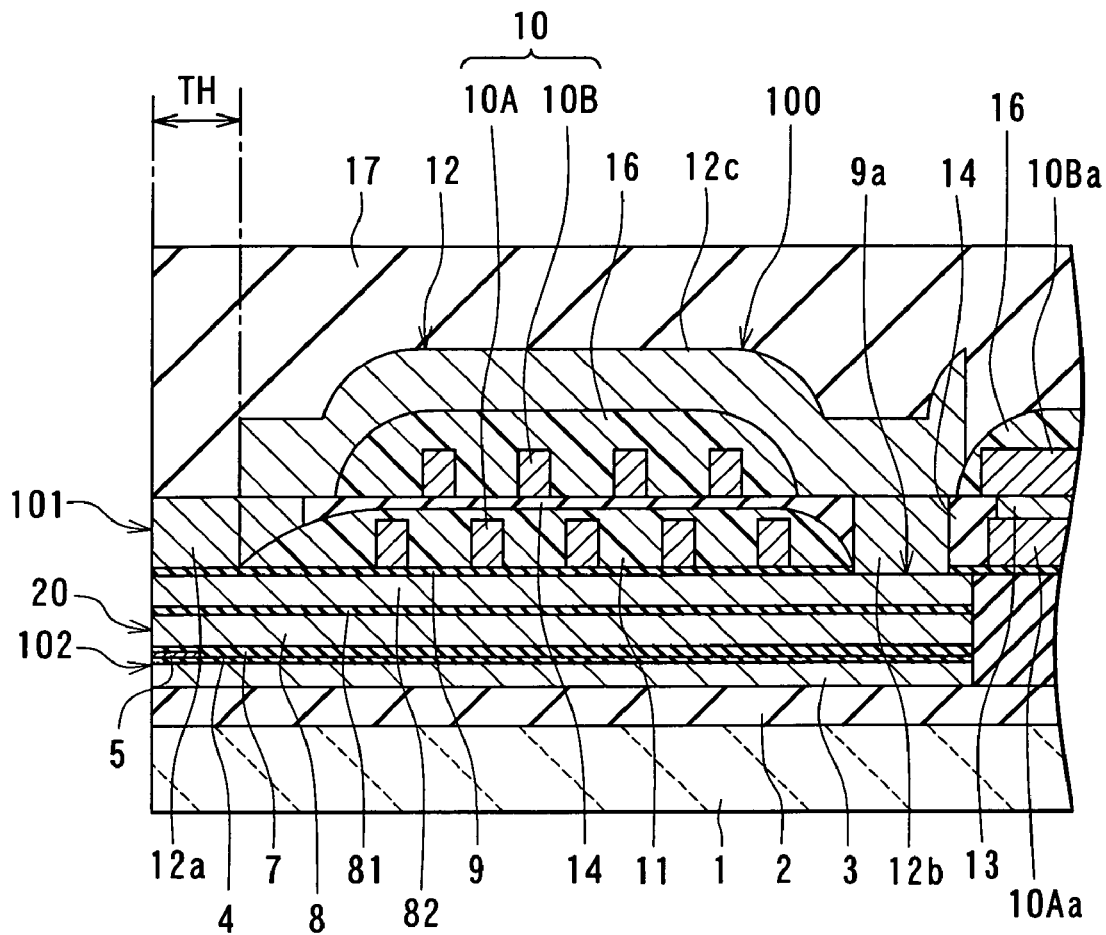
FIG. 23 is a cross-sectional view of a thin-film magnetic head element of a modification example of the first embodiment of the invention, wherein the cross section is orthogonal to the air bearing surface and the substrate.
Figure 24:
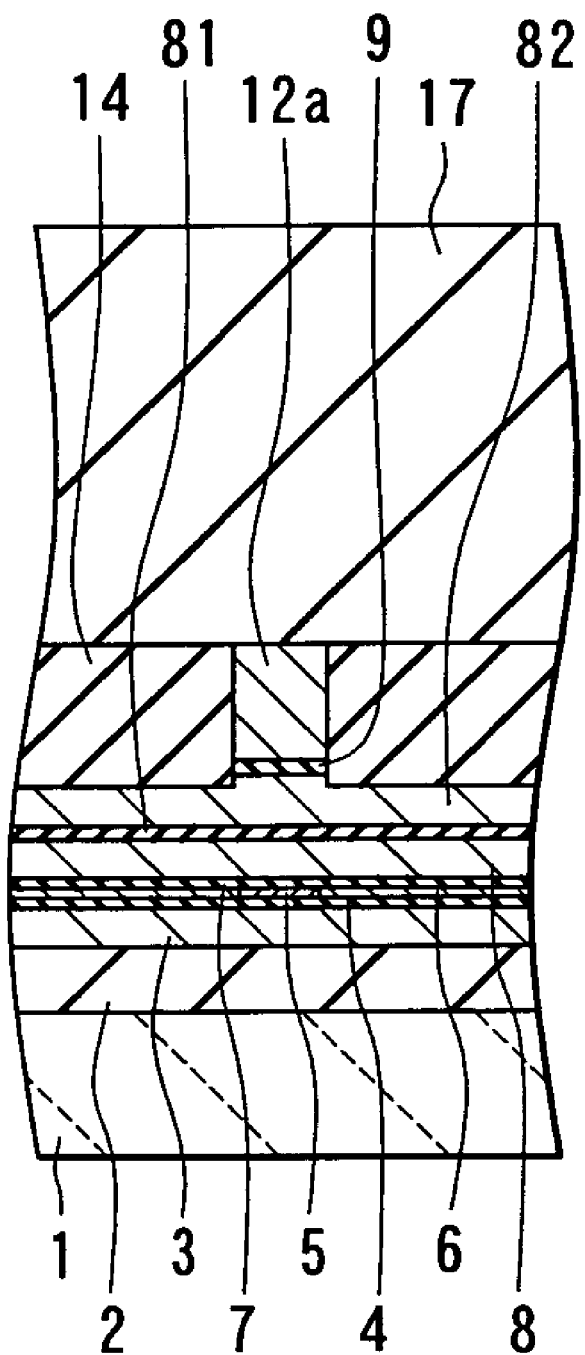
FIG. 24 is a cross-sectional view of a pole portion of the thin-film magnetic head element of the modification example of the first embodiment of the invention, wherein the cross section is parallel to the air bearing surface.

Next, a top shield layer 8 for the read element is formed on the top shield gap film 7. The top shield layer 8 is made of a magnetic material and has a thickness of 3 to 4 μm, for example, and also functions as a bottom pole layer of the write element. The top shield layer 8 is made of a soft magnetic material such as NiFe, CoFe, CoFeNi or FeN. The top shield layer 8 is formed by plating or sputtering, for example. Alternatively, as shown in FIG. 23 and FIG. 24, a top shield layer 8 that does not function as the bottom pole layer, a separating layer 81 and a bottom pole layer 82 may be provided in place of the top shield layer 8 that also functions as the bottom pole layer. The separating layer 81 is made of a nonmagnetic material such as alumina and formed by sputtering, for example, on the top shield layer 8 that does not function as the bottom pole layer. The bottom pole layer 82 is formed on the separating layer 81. The separating layer 81 may be a nonmagnetic conductive layer.

Next, a write gap layer 9 made of a nonmagnetic material such as alumina and having a thickness of 50 to 300 nm, for example, is formed on the top shield layer 8 (or the bottom pole layer 82) by a method such as sputtering. Next, to make a magnetic path, a portion of the write gap layer 9 is etched to form a contact hole 9a in a center portion of a thin-film coil 10 described later.

Next, a first layer portion 10A of the thin-film coil 10 made of copper (Cu), for example, and having a thickness of 2 to 3 μm, for example, is formed on the write gap layer 9. The thin-film coil 10 incorporates this first layer portion 10A and a second layer portion 10B described later. In FIG. 9, numeral 10Aa indicates a connecting portion of the first layer portion 10A connected to the second layer portion 10B. The first layer portion 10A is wound around the contact hole 9a.

Next, an insulating layer 11 having a specific pattern is formed to cover the first layer portion 10A and the write gap layer 9 disposed around the first layer portion 10A. The insulating layer 11 is made of an organic insulating material that exhibits fluidity when heated, such as photoresist. Next, heat treatment is performed at a specific temperature to flatten the surface of the insulating layer 11. Through this heat treatment, each of the outer and inner edge portions of the insulating layer 11 is made to have a shape of rounded sloped surface.

Next, a track width defining layer 12a of a top pole layer 12 made of a magnetic material for the write element is formed on regions of the write gap layer 9 and the insulating layer 11, the regions extending from a sloped portion of the insulating layer 11 closer to the air bearing surface 20 described later toward the air bearing surface 20. The top pole layer 12 is made up of the track width defining layer 12a, and a coupling portion layer 12b and a yoke portion layer 12c that will be described later.

The track width defining layer 12a has: a tip portion that is formed on the write gap layer 9 and functions as the pole portion of the top pole layer 12; and a connecting portion that is formed on the sloped portion of the insulating layer 11 closer to the air bearing surface 20 and connected to the yoke portion layer 12c. The tip portion has a width equal to the write track width. The connecting portion has a width greater than that of the tip portion.

When the track width defining layer 12a is formed, the coupling portion layer 12b made of a magnetic material is formed in the contact hole 9a and a connecting layer 13 made of a magnetic material is formed on the connecting portion 10Aa at the same time. The coupling portion layer 12b makes up a portion of the top pole layer 12 that is magnetically coupled to the top shield layer 8 (or the bottom pole layer 82).

Next, pole trimming is performed. That is, in a region around the track width defining layer 12a, the write gap layer 9 and at least a portion of the pole portion of the top shield layer 8 (or the bottom pole layer 82) close to the write gap layer 9 are etched, using the track width defining layer 12a as a mask. As a result, as shown in FIG. 10, a trim structure is formed, wherein the pole portion of the top pole layer 12, the write gap layer 9 and at least a portion of the pole portion of the top shield layer 8 (or the bottom pole layer 82) have equal widths. The trim structure has an effect of preventing an increase in effective track width resulting from an expansion of magnetic flux near the write gap layer 9.

Next, an insulating layer 14 made of an inorganic insulating material such as alumina and having a thickness of 3 to 4 µm, for example, is formed over the entire surface. The insulating layer 14 is then polished by chemical mechanical polishing, for example, to reach the surfaces of the track width defining layer 12a, the coupling portion layer 12b and the connecting layer 13, and flattened.

Next, the second layer portion 10B made of copper (Cu), for example, and having a thickness of 2 to 3 µm, for example, is formed on the flattened insulating layer 14. In FIG. 9, numeral 10Ba indicates a connecting portion of the second layer portion 10B connected to the connecting portion 10Aa of the first layer portion 10A through the connecting layer 13. The second layer portion 10B is wound around the coupling portion layer 12b.

Next, an insulating layer 16 having a specific pattern is formed to cover the second layer portion 10B and the insulating layer 14 disposed around the second layer portion 10B. The insulating layer 16 is made of an organic insulating material that exhibits fluidity when heated, such as photoresist. Next, heat treatment is given at a specific temperature to flatten the surface of the insulating layer 16. Through this heat treatment, each of the outer and inner edge portions of the insulating layer 16 is made to have a shape of rounded sloped surface.

Next, the yoke portion layer 12c made of a magnetic material for the write element such as Permalloy is formed on the track width defining layer 12a, the insulating layers 14 and 16, and the coupling portion layer 12b. The yoke portion layer 12c makes up the yoke portion of the top pole layer 12. One of the ends of the yoke portion layer 12c closer to the air bearing surface 20 is located at a distance from the air bearing surface 20. The yoke portion layer 12c is connected to the top shield layer 8 (or the bottom pole layer 82) through the coupling portion layer 12b.

Next, an overcoat layer 17 made of alumina, for example, is formed to cover the entire surface. Next, the terminals 291 to 294 are formed in the top surface of the overcoat layer 17. Finally, the air bearing surface 20 is formed and the slider 210 including the thin-film magnetic head element 100 is completed. The base body 211 of the slider 210 is mainly made up of the substrate 1 and the overcoat layer 17.

The thin-film magnetic head element 100 thus manufactured comprises the write element 101 and the read element 102. The write element 101 incorporates the bottom pole layer (the top shield layer 8 or the bottom pole layer 82) and the top pole layer 12 that are magnetically coupled to each other and include the pole portions that are opposed to each other and placed in regions on a side of the air bearing surface 20. The write element 101 further incorporates: the write gap layer 9 provided between the pole portion of the bottom pole layer and the pole portion of the top pole layer 12; and the thin-film coil 10 at least part of which is placed between the bottom pole layer and the top pole layer 12 and insulated from the bottom pole layer and the top pole layer 12.

In the thin-film magnetic head element 100, as shown in FIG. 9, throat height TH is the length from the air bearing surface 20 to the end of the insulating layer 11 closer to the air bearing surface 20. The throat height is the length (height) from the air bearing surface 20 to the point at which the distance between the two pole layers starts to increase.

The read element 102 incorporates: the MR element 5 disposed near the air bearing surface 20; and the bottom shield layer 3 and the top shield layer 8 for shielding the MR element 5, wherein portions of the bottom shield layer 3 and the top shield layer 8 close to the air bearing surface 20 are opposed to each other with the MR element 5 disposed in between.

The thin-film coil 10 has ends connected to the terminals 291 and 292, respectively, that are shown in FIG. 5. The MR element 5 has ends connected to the terminals 293 and 294, respectively, that are shown in FIG. 5, through the electrode layers 6.

The thin-film magnetic head element 100 writes data on the recording medium 262 by using the write element 101 and reads data written on the recording medium 262 by using the read element 102. The magnetic disk drive of the embodiment comprises the read/write processing circuit that applies a write signal to the thin-film coil 10 in the write element 101 when data is written and that receives a read signal outputted from the MR element 5 in the read element 102 when data is read.

Figure 3:
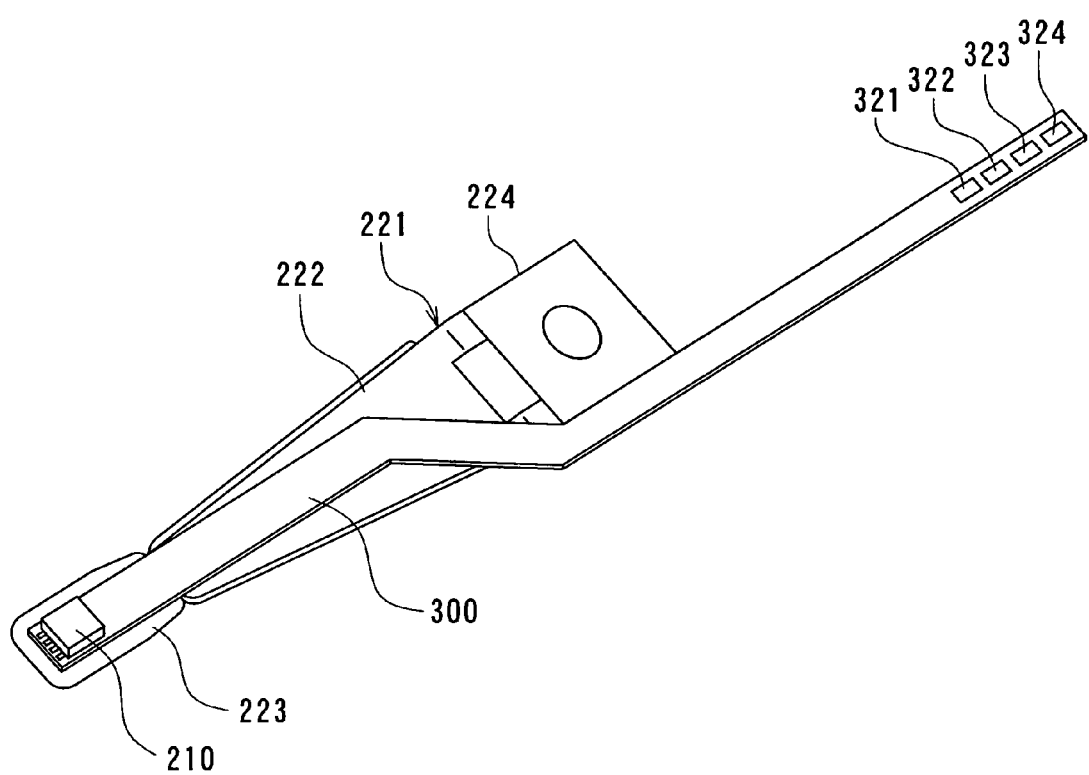
FIG. 3 is a perspective view illustrating the magnetic head slider supporting apparatus of the first embodiment of the invention.
Figure 4:
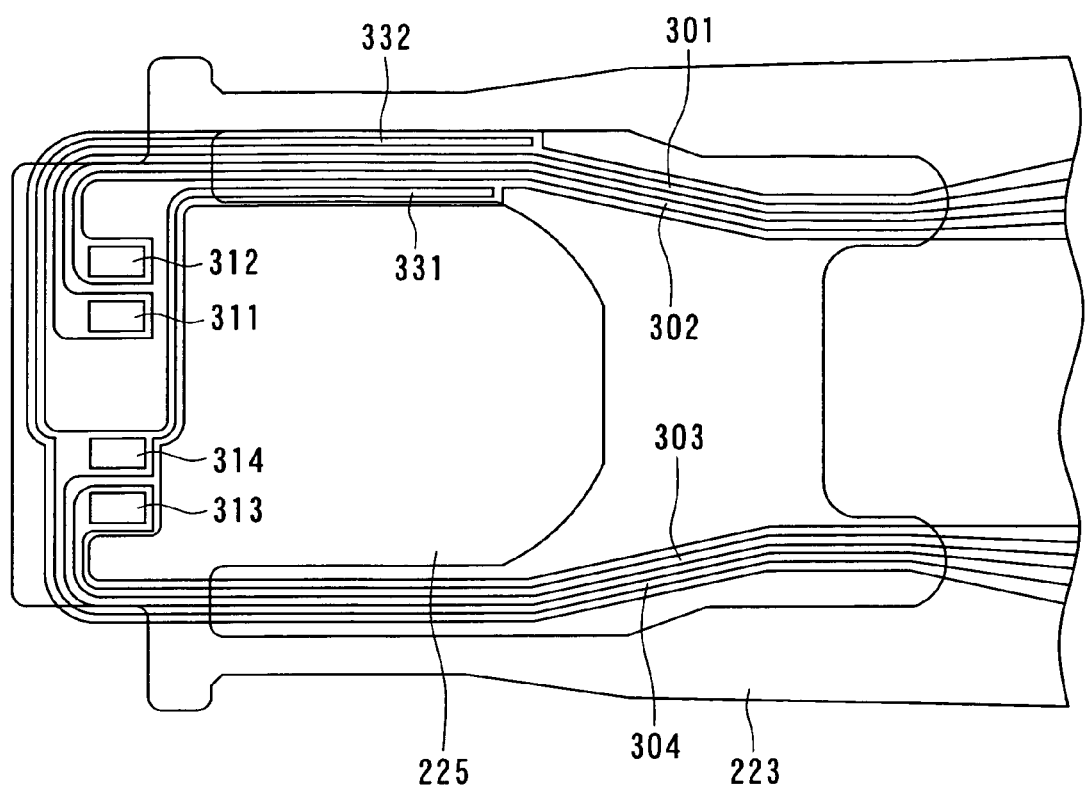
FIG. 4 is an enlarged top view illustrating the tip of the magnetic head slider supporting apparatus of FIG. 3 and a neighborhood thereof.

Reference is now made to FIG. 3 and FIG. 4 to describe details of the magnetic head slider supporting apparatus of the embodiment. FIG. 3 is a perspective view illustrating the magnetic head slider supporting apparatus. FIG. 4 is an enlarged top view illustrating the tip of the magnetic head slider supporting apparatus of FIG. 3 and a neighborhood thereof. FIG. 3 illustrates the supporting apparatus to which the slider 210 is attached. FIG. 4 illustrates the supporting apparatus from which the slider 210 is detached.

As shown in FIG. 3, the magnetic head slider supporting apparatus comprises the suspension 221 that flexibly supports the slider 210 including the write element 101 and the read element 102 such that the slider 210 faces toward the recording medium 262. As described above, the suspension 221 incorporates the load beam 222, the flexure 223, and the base plate 224. As shown in FIG. 4, the gimbal section 225 for maintaining the orientation of the slider 210 is provided in a portion of the flexure 223 to which the slider 210 is attached.

As shown in FIG. 3, the magnetic head slider supporting apparatus further comprises a flexible wiring board 300 placed along the load beam 222. The flexible wiring board 300 has an end located at the tip of the flexure 223, and the other end located farther from the flexure 223 than the base plate 224. The flexible wiring board 300 includes: terminals 311, 312, 313 and 314 for connection to elements, the terminals 311, 312, 313 and 314 being located at one of the ends of the flexible wiring board 300; terminals 321, 322, 323 and 324 for connection to external devices, the terminals 321, 322, 323 and 324 being located at the other of the ends of the flexible wiring board 300; a first line 301 for connecting the terminals 311 and 321; a second line 302 for connecting the terminals 312 and 322; a third line 303 for connecting the terminals 313 and 323; and a fourth line 304 for connecting the terminals 314 and 324.

The terminals 311, 312, 313 and 314 are designed to be connected to the terminals 291, 292, 293 and 294 of the slider 210, respectively. The terminals 321, 322, 323 and 324 are designed to be connected to the read/write processing circuit. The lines 301 and 302 are connected to the write element 101 in the slider 210 through the terminals 311, 312 and the terminals 291, 292, and transmit write signals to be applied to the write element 101. The lines 303 and 304 are connected to the read element 102 in the slider 210 through the terminals 313, 314 and the terminals 293, 294, and transmit read signals outputted from the read element 102.

The lines 301 to 304 include portions located along the load beam 222. These portions of the lines 301 to 304 are located side by side in the order of the first line 301, the second line 302, the third line 303 and the fourth line 304.

Figure 1:
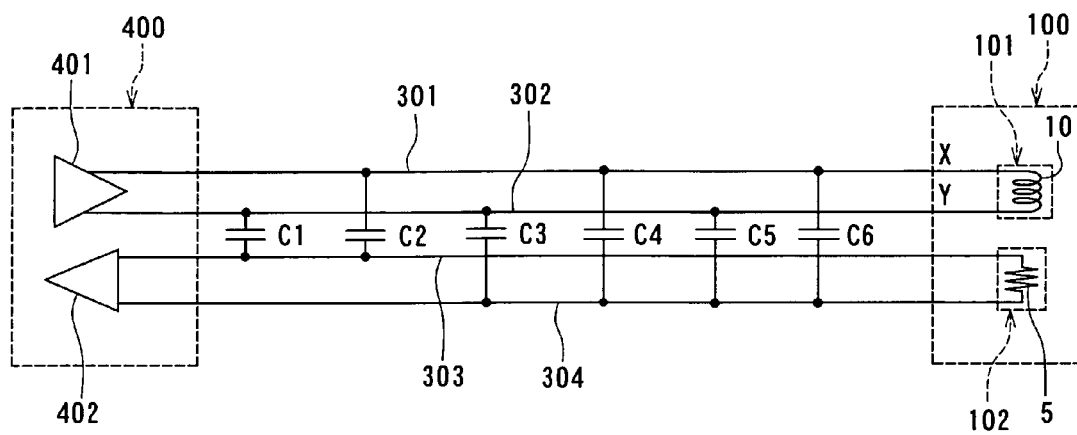
FIG. 1 is a schematic diagram illustrating lines of a magnetic head slider supporting apparatus of a first embodiment of the invention, a thin-film magnetic head element and a read/write processing circuit.

FIG. 1 is a schematic diagram illustrating the lines 301 to 304 of the magnetic head slider supporting apparatus of the embodiment, the thin-film magnetic head element 100 and the read/write processing circuit 400. As shown in FIG. 1, the read/write processing circuit 400 incorporates an amplifier 401 for outputting write signals, and another amplifier 402 for amplifying read signals. The amplifier 401 has two outputs connected to both ends of the thin-film coil 10 in the write element 101 through the terminals 321 and 322, the lines 301 and 302, the terminals 311 and 312, and the terminals 291 and 292. The terminals 291 and 292 may be hereinafter called write terminals X and Y. The amplifier 402 has two inputs connected to both ends of the MR element 5 in the read element 102 through the terminals 323 and 324, the lines 303 and 304, the terminals 313 and 314, and the terminals 293 and 294.

Figure 2:
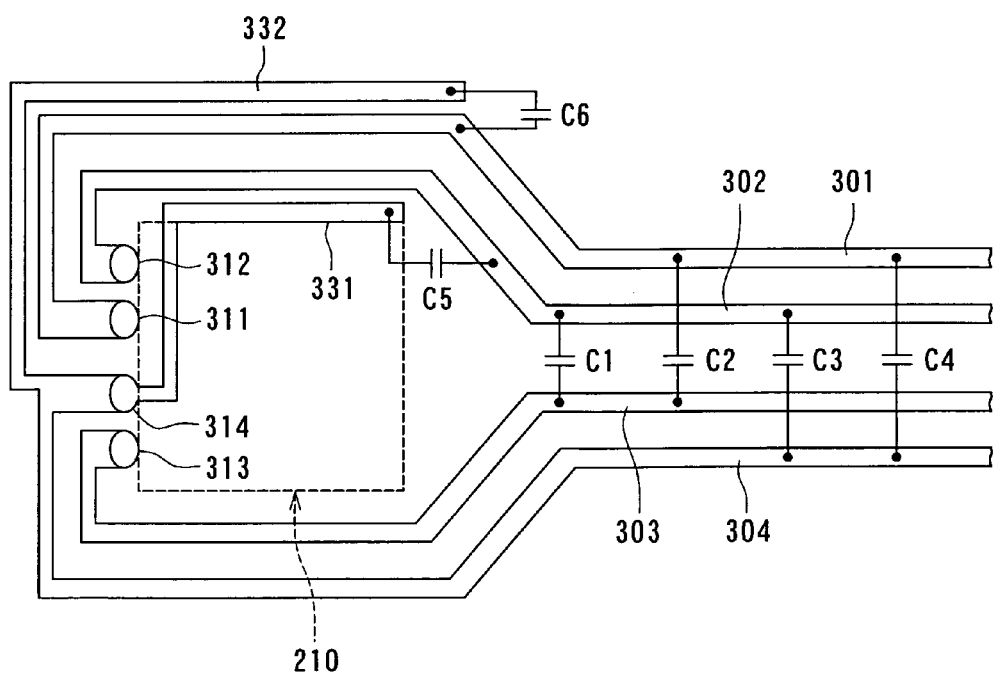
FIG. 2 is a view for schematically illustrating the positional relationship of the lines of the first embodiment of the invention.

FIG. 2 is a view for schematically illustrating the positional relationship of the lines 301 to 304. In addition to the lines 301 to 304, as shown in FIG. 2 and FIG. 4, the flexible wiring board 300 includes first and second conductors 331 and 332 that generate parasitic capacitances for reducing a potential difference created between the lines 303 and 304 due to write signals transmitted through the lines 301 and 302. The conductors 331 and 332 are each disposed to extend from the terminal 314. The conductor 331 is connected to the line 304 through the terminal 314 and disposed adjacent to the line 302 with a space. The conductor 331 thereby generates a first parasitic capacitance between the lines 302 and 304. The conductor 332 is connected to the line 304 and disposed adjacent to the line 301 with a space. The conductor 332 thereby generates a second parasitic capacitance between the lines 301 and 304.

In the embodiment equations $C5=C1-C3$ and $C6=C2-C4$ hold, where C1 is the parasitic capacitance between the lines 302 and 303, C2 is the parasitic capacitance between the lines 301 and 303, C3 is the parasitic capacitance between the lines 302 and 304 excluding the first parasitic capacitance, C4 is the parasitic capacitance between the lines 301 and 304 excluding the second parasitic capacitance, C5 is the first parasitic capacitance, and C6 is the second parasitic capacitance.

Features of the embodiment will now be described in detail. Reference is now made to FIG. 11 to FIG. 14 to describe an occurrence of crosstalk between the lines 301, 302 connected to the write element 101 and the lines 303, 304 connected to the read element 102 when the conductors 331 and 332 are not provided.

Figure 11:
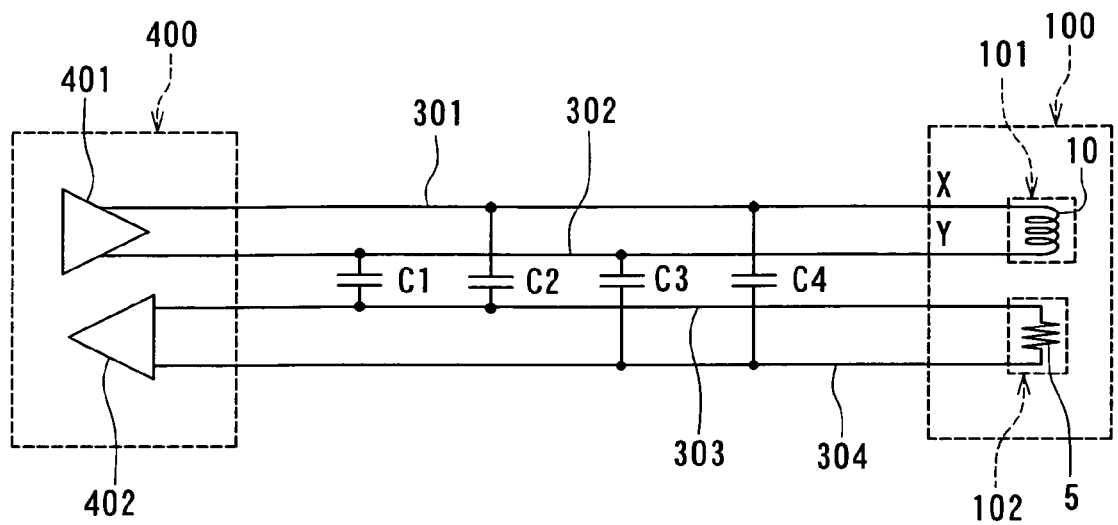
FIG. 11 is a schematic diagram illustrating lines, a thin-film magnetic head element and a read/write processing circuit of a reference example for comparison with the first embodiment of the invention.
Figure 12:
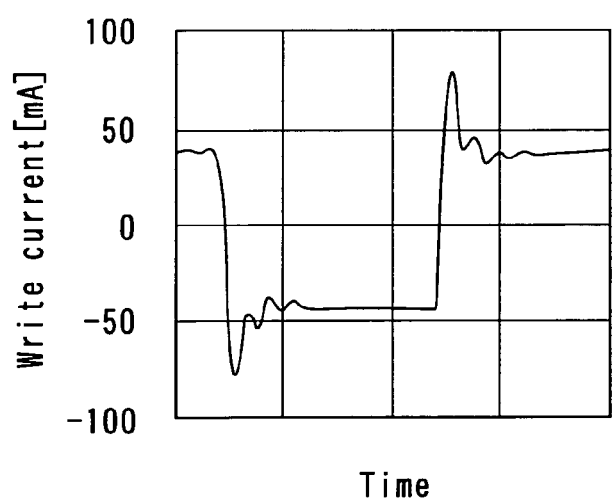
FIG. 12 is a plot illustrating a waveform of a write current fed to the thin-film coil of FIG. 11.

FIG. 11 is a schematic diagram illustrating the lines 301 to 304, the thin-film magnetic head element 100 and the read/write processing circuit 400 of a reference example wherein the conductors 331 and 332 are not provided. This schematic diagram is the same as the one shown in FIG. 1 except that the parasitic capacitances C5 and C6 do not exist. Consideration will now be given to a case in which a write current having a waveform as shown in FIG. 12 is fed to the thin-film coil 10 of the write element 101 in the configuration shown in FIG. 11. In FIG. 12, the horizontal axis indicates time and the vertical axis indicates the write current. The write current is indicated such that the direction starting from the write terminal Y through the thin-film coil 10 toward the write terminal X is positive and that the opposite direction is negative.

Figure 13:
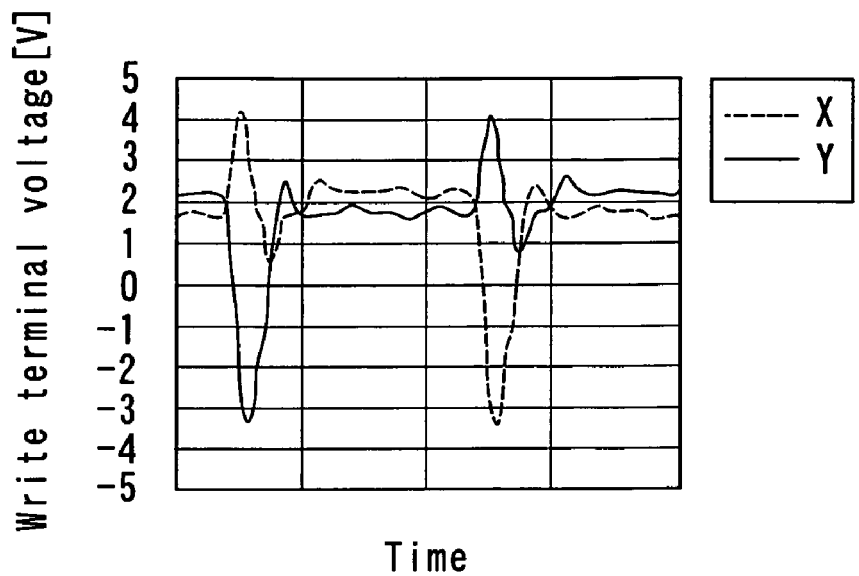
FIG. 13 is a plot illustrating an example of waveforms of voltages applied to a write terminal for feeding the write current of FIG. 12.

FIG. 13 illustrates an example of waveforms of voltages applied to the write terminals X and Y for feeding the write current of FIG. 12. In FIG. 13, the horizontal axis indicates time and the vertical axis indicates the voltages applied to the write terminals X and Y. The voltage applied to the write terminal X is applied to the line 301. The voltage applied to the write terminal Y is applied to the line 302. In the example of FIG. 13, the waveform of the voltage applied to the line 301 and the waveform of the voltage applied to the line 302 are asymmetric with each other.

As shown in FIG. 13, if the voltages applied to the lines 301 and 302 change abruptly, voltages are induced on the lines 303 and 304 connected to the read element 102 through the parasitic capacitances C1 to C4. Here, the distance between the lines 302 and 303 is shorter than the distance between the lines 302 and 304. Therefore, the parasitic capacitance C1 is greater than the parasitic capacitance C3. As a result, the voltages induced on the lines 303 and 304 in response to the change in voltage on the line 302 are of different values. Similarly, the distance between the lines 301 and 303 is shorter than the distance between the lines 301 and 304. Therefore, the parasitic capacitance C2 is greater than the parasitic capacitance C4. As a result, the voltages induced on the lines 303 and 304 in response to the change in voltage on the line 301 are of different values.

Figure 14:
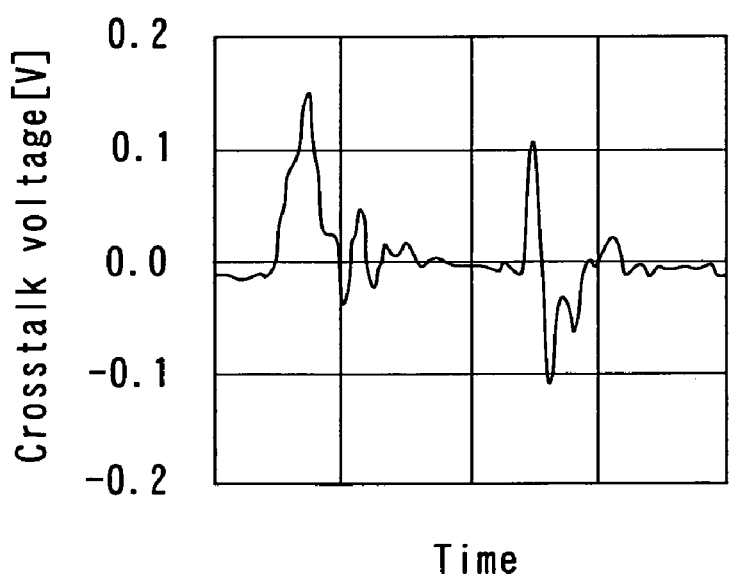
FIG. 14 is a plot illustrating a waveform of crosstalk voltage emerging on a line connected to the read element of FIG. 11.

Because of these facts, a potential difference is created between the lines 303 and 304 due to the changes in voltages applied to the lines 301 and 302. In such a manner, crosstalk occurs between the lines 301, 302 connected to the write element 101 and the lines 303, 304 connected to the read element 102. The potential difference created between the lines 303 and 304 due to the changes in voltages applied to the lines 301 and 302 is hereinafter called a crosstalk voltage. FIG. 14 illustrates the waveform of this crosstalk voltage. In FIG. 14, the horizontal axis indicates time and the vertical axis indicates the crosstalk voltage.

In the embodiment, as described above, the first parasitic capacitance C5 is generated between the lines 302 and 304 by the conductor 331, so that the equation $C5=C1-C3$ holds. As a result, the total parasitic capacitance between the lines 302 and 304 is $C3+C5$ which is equal to the parasitic capacitance C1 between the lines 302 and 303. Therefore, according to the embodiment, the voltages induced on the lines 303 and 304 in response to the change in voltage on the line 302 are of equal values.

In the embodiment, as described above, the second parasitic capacitance C6 is created between the lines 301 and 304 by the conductor 332, so that the equation $C6=C2-C4$ holds. As a result, the total parasitic capacitance between the lines 301 and 304 is $C4+C6$ which is equal to the parasitic capacitance C2 between the lines 301 and 303. Therefore, according to the embodiment, the voltages induced on the lines 303 and 304 in response to the change in voltage on the line 301 are of equal values.

Because of these facts, in the embodiment, the potential difference created between the lines 303 and 304 due to the changes in voltages applied to the lines 301 and 302 is theoretically zero. Therefore, according to the embodiment, it is possible to greatly reduce the crosstalk between the lines 301, 302 connected to the write element 101 and the lines 303, 304 connected to the read element 102.

The foregoing description relates to the case in which the equations $C5=C1-C3$ and $C6=C2-C4$ hold. However, as long as the parasitic capacitances C5 and C6 fall within ranges of $0<C5<2(C1-C3)$ and $0<C6<2(C2-C4)$, it is possible to make crosstalk smaller, compared with a case in which the parasitic capacitances C5 and C6 do not exist. Within these ranges, the closer the parasitic capacitances C5 and C6 to $(C1-C3)$ and $(C2-C4)$, respectively, the smaller is the crosstalk.

According to the embodiment, it is possible to reduce the crosstalk not only in a case where voltages of asymmetric waveforms are applied to the lines 301 and 302 as write signals but in a case where voltages of substantially symmetric waveforms are applied to the lines 301 and 302 as write signals. When voltages of substantially symmetric waveforms are applied to the lines 301 and 302 as write signals, no potential difference is created between the lines 303 and 304 due to the changes in voltages applied to the lines 301 and 302, as long as the equation (C1−C2)=(C3−C4) holds, even through the parasitic capacitances C5 and C6 do not exist. In practice, however, it holds that (C1−C2)>(C3−C4). Therefore, when voltages of substantially symmetric waveforms are applied to the lines 301 and 302 as write signals, crosstalk occurs if the parasitic capacitances C5 and C6 do not exist. In the embodiment, as described above, the parasitic capacitances C5 and C6 are created, so that the voltages induced on the lines 303 and 304 in response to the change in voltage on the line 301 are of equal values and that the voltages induced on the lines 303 and 304 in response to the change in voltage on the line 302 are of equal values. As a result, according to the embodiment, it is possible to reduce crosstalk also in the case where voltages of substantially symmetric waveforms are applied to the lines 301 and 302 as write signals.

Figure 15:
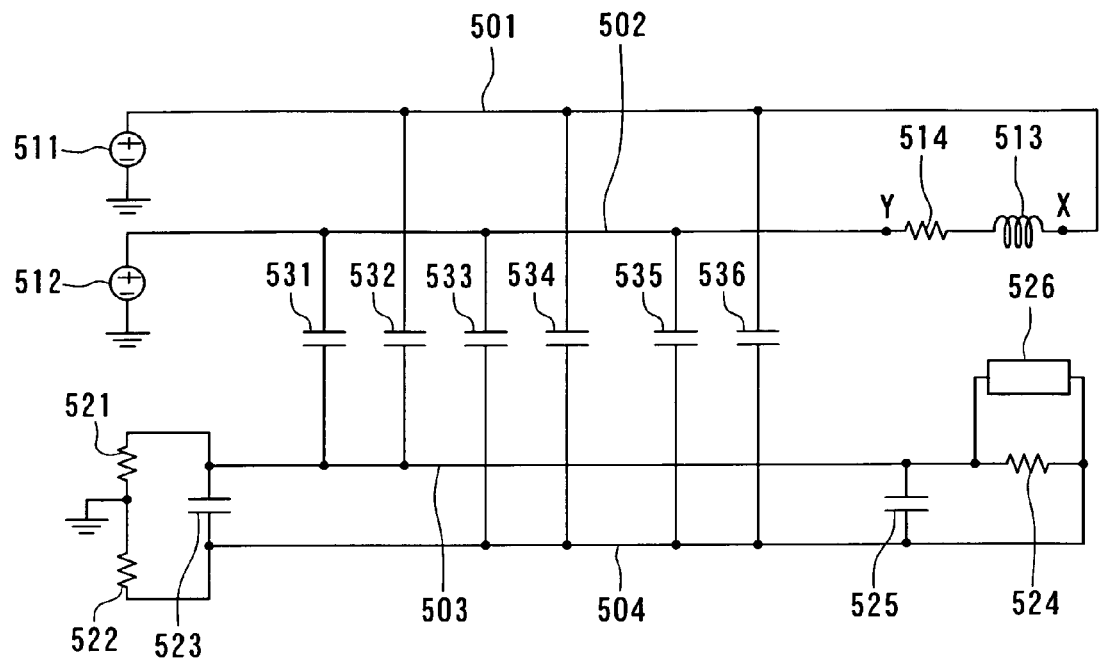
FIG. 15 is a schematic diagram illustrating a circuit used for a simulation performed for confirming the effect of the first embodiment of the invention.

A result of simulation performed for confirming the effect of the embodiment will now be described. FIG. 15 is a schematic diagram illustrating a circuit used for the simulation. The circuit for the simulation comprises lines 501 to 504 corresponding to the lines 301 to 304. The line 501 has an end connected to a voltage source 511. The line 502 has an end connected to a voltage source 512. A coil 513 and a resistor 514 connected in series are provided between the other end of the line 501 and the other end of the line 502. The coil 513 and the resistor 514 correspond to the write element 101. The coil 513 has an inductance of 4 nH. The resistor 514 has a resistance of 2 ohms. In this circuit, the node between the line 501 and the coil 513 is the write terminal X and the node between the line 502 and the resistor 514 is the write terminal Y.

The line 503 has an end grounded through a resistor 521. The line 504 has an end grounded through a resistor 522. The end of the line 503 and the end of the line 504 are also connected to each other through a capacitor 523. Each of the resistors 521 and 522 has a resistance of 1.5 kiloohms. The capacitor 523 has a capacitance of 7 pF. The other end of the line 503 is connected to the other end of the line 504 through a resistor 524. The other end of the line 503 is connected to the other end of the line 504 also through a capacitor 525. The resistor 524 and the capacitor 525 correspond to the read element 102. The resistor 524 has a resistance of 300 ohms. The capacitor 525 has a capacitance of 0.4 pF. A voltmeter 526 is connected to ends of the resistor 524.

The line 502 is connected to the line 503 through a capacitor 531 corresponding to the parasitic capacitance C1. The line 501 is connected to the line 503 through a capacitor 532 corresponding to the parasitic capacitance C2. The line 502 is connected to the line 504 through a capacitor 533 corresponding to the parasitic capacitance C3. The line 501 is connected to the line 504 through a capacitor 534 corresponding to the parasitic capacitance C4. The line 502 is connected to the line 504 through a capacitor 535 corresponding to the parasitic capacitance C5. The line 501 is connected to the line 504 through a capacitor 536 corresponding to the parasitic capacitance C6. The capacitors 531 to 536 have capacitances of 0.65 pF, 0.25 pF, 0.16 pF, 0.10 pF, 0.49 pF, and 0.15 pF, respectively. These values satisfy the condition under which the equations C5=C1−C3 and C6=C2−C4 hold.

Figure 17:
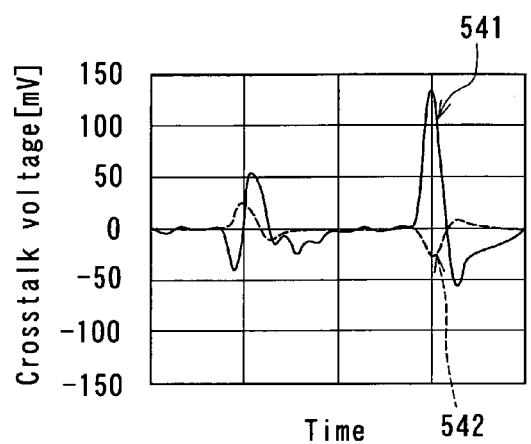
FIG. 17 is a plot illustrating waveforms showing a result of the simulation performed for confirming the effect of the first embodiment of the invention.

In the simulation, first, the capacitors 535 and 536 were excluded from the circuit of FIG. 15, and voltages of asymmetric waveform is shown in FIG. 13 were applied as write signals to the write terminals X and Y from the voltage sources 511 and 512 through the lines 501 and 502. Then, the potential difference across the resistor 524 at that time was measured by the voltmeter 526. This potential difference was defined as a crosstalk voltage. This crosstalk voltage is indicated with a solid line with numeral 541 in FIG. 17. In FIG. 17, the horizontal axis indicates time and the vertical axis indicates the crosstalk voltage.

Figure 16:
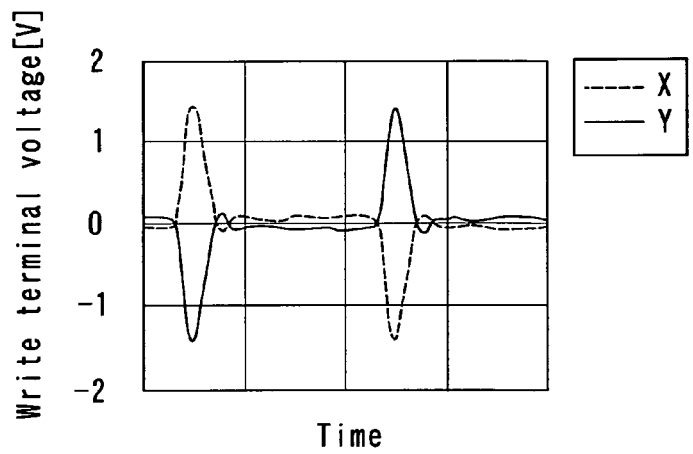
FIG. 16 is a plot illustrating waveforms of the write signals used in the simulation performed for confirming the effect of the first embodiment of the invention.

In the simulation, next, the capacitors 535 and 536 were excluded from the circuit of FIG. 15, and voltages of substantially symmetric waveforms shown in FIG. 16 were applied as write signals to the write terminals X and Y from the voltage sources 511 and 512 through the lines 501 and 502. Then, the potential difference across the resistor 524 at that time was measured by the voltmeter 526. This potential difference was defined as a crosstalk voltage. This crosstalk voltage is indicated with a broken line with numeral 542 in FIG. 17.

As shown in FIG. 17, it is noted that, when the capacitors 535 and 536 corresponding to the parasitic capacitances C5 and C6 are not provided, crosstalk occurs in both of the case in which voltages of asymmetric waveforms are applied to the write terminals X and Y and the case in which voltages of substantially symmetric waveforms are applied to the write terminals X and Y.

In the simulation, next, in the circuit of FIG. 15 including the capacitors 535 and 536, voltages of asymmetric waveforms shown in FIG. 13 were applied as write signals to the write terminals X and Y from the voltage sources 511 and 512 through the lines 501 and 502. Then, the potential difference across the resistor 524 at that time was measured by the voltmeter 526. This potential difference was defined as a crosstalk voltage. This crosstalk voltage was nearly zero.

In the simulation, next, in the circuit of FIG. 15 including the capacitors 535 and 536, voltages of substantially symmetric waveforms shown in FIG. 16 were applied as write signals to the write terminals X and Y from the voltage sources 511 and 512 through the lines 501 and 502. Then, the potential difference across the resistor 524 at that time was measured by the voltmeter 526. This potential difference was defined as a crosstalk voltage. This crosstalk voltage was nearly zero.

The result of the simulation thus described indicates that, according to the embodiment, it is possible to greatly reduce crosstalk in both of the case in which voltages of asymmetric waveforms are applied to the write terminals X and Y and the case in which voltages of substantially symmetric waveforms are applied to the write terminals X and Y.

Second Embodiment

Figure 18:
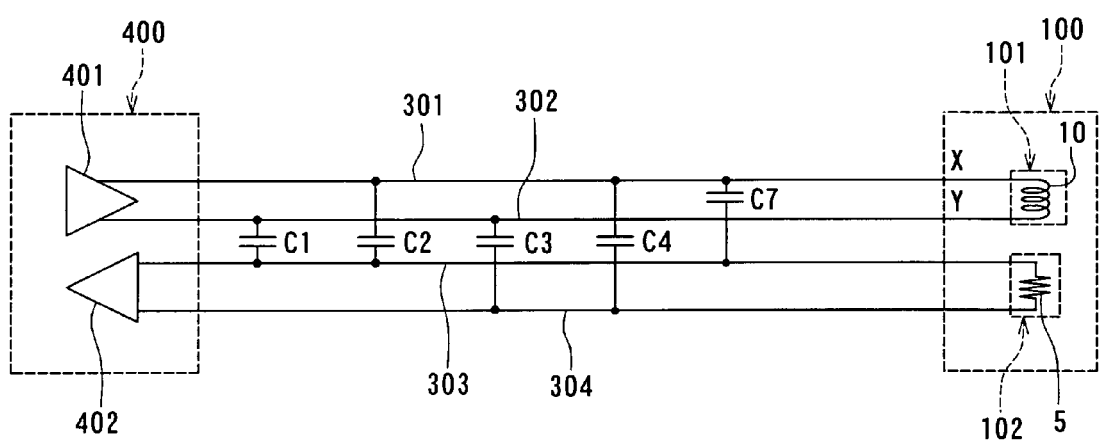
FIG. 18 is a schematic diagram illustrating lines of a magnetic head slider supporting apparatus of a second embodiment of the invention, a thin-film magnetic head element and a read/write processing circuit.
Figure 19:
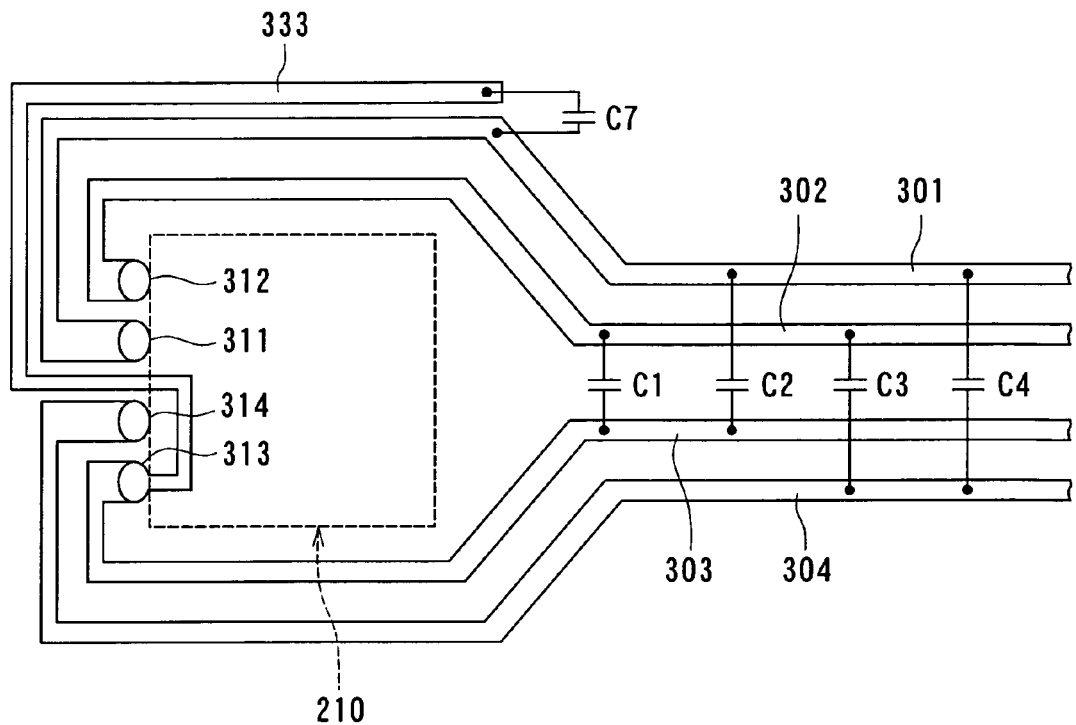
FIG. 19 is a view for schematically illustrating the positional relationship of the lines of the second embodiment of the invention.

A second embodiment of the invention will now be described. The second embodiment is applied to a case in which voltages of substantially symmetric waveforms are applied to the lines 301 and 302 as write signals. FIG. 18 is a schematic diagram illustrating the lines 301 to 304 of a magnetic head slider supporting apparatus of the second embodiment, the thin-film magnetic head element 100 and the read/write processing circuit 400. FIG. 19 is a view for schematically illustrating the positional relationship of the lines 301 to 304. In the second embodiment, as shown in FIG. 19, a conductor 333 is provided in place of the conductors 331 and 332 of the first embodiment. The conductor 333 is incorporated in the flexible wiring board 300. The conductor 333 is connected to the line 303 through the terminal 313 and disposed adjacent to the line 301 with a space. The conductor 333 thereby generates a parasitic capacitance between the lines 301 and 303. This parasitic capacitance is provided for reducing a potential difference created between the lines 303 and 304 due to the write signals transmitted through the lines 301 and 302.

In the second embodiment an equation $C7=(C1-C2)-(C3-C4)$ holds, where C1 is the parasitic capacitance between the lines 302 and 303, C2 is the parasitic capacitance between the lines 301 and 303 excluding the parasitic capacitance created by the conductor 333, C3 is the parasitic capacitance between the lines 302 and 304, C4 is the parasitic capacitance between the lines 301 and 304, and C7 is the parasitic capacitance created by the conductor 333. The remainder of configuration of the second embodiment is the same as that of the first embodiment.

In the second embodiment, voltages of substantially symmetric waveforms are applied to the lines 301 and 302 as write signals. In this case, the voltage induced on the line 303 in response to changes in voltages on the lines 301 and 302 depends on $C1-(C2+C7)$. On the other hand, the voltage induced on the line 304 in response to changes in voltages on the lines 301 and 302 depends on $C3-C4$. In the second embodiment, since the equation $C7=(C1-C2)-(C3-C4)$ holds as described above, an equation $C1-(C2+C7)=C3-C4$ holds. Therefore, the voltage induced on the line 303 and the voltage induced on the line 304 are of nearly equal values. That is, the potential difference created between the lines 303 and 304 due to changes in voltages applied to the lines 301 and 302 is nearly zero. Therefore, according to the embodiment, it is possible to greatly reduce the crosstalk between the lines 301, 302 connected to the write element 101 and the lines 303, 304 connected to the read element 102.

Figure 20:
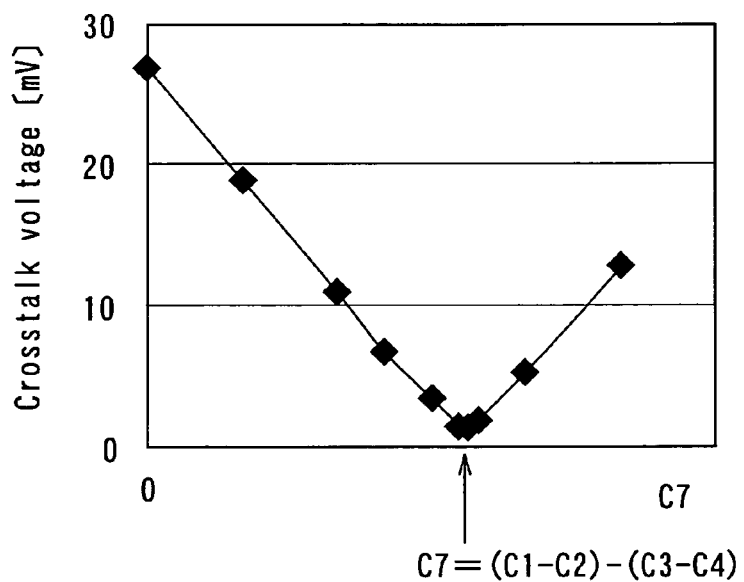
FIG. 20 is a plot illustrating a result of a simulation performed for confirming an effect of the second embodiment of the invention.

A result of simulation performed for confirming the effect of the second embodiment will now be described. A circuit used for this simulation has a configuration in which the capacitors 535 and 536 are excluded from the circuit of FIG. 15 and a capacitor corresponding to the parasitic capacitance C7 is added instead to connect the line 501 to the line 503. In the simulation, the relationship between a crosstalk voltage and the capacitance of the capacitor corresponding to the parasitic capacitance C7 was obtained. The result is shown in FIG. 20. In FIG. 20, the horizontal axis indicates the capacitance of the capacitor corresponding to the parasitic capacitance C7, and the vertical axis indicates the crosstalk voltage. As shown in FIG. 20, the crosstalk voltage is minimum when the equation $C7=(C1-C2)-(C3-C4)$ holds.

The foregoing description relates to the case in which the equation $C7=(C1-C2)-(C3-C4)$ holds. However, as long as the parasitic capacitance C7 falls within a range of $0<C7<2\{(C1-C2)-(C3-C4)\}$, it is possible to make crosstalk smaller, compared with a case in which the parasitic capacitance C7 does not exist. Within this range, the closer the parasitic capacitance C7 to $(C1-C2)-(C3-C4)$, the smaller is the crosstalk.

The remainder of operations and effects of the second embodiment are similar to those of the first embodiment.

Third Embodiment

Figure 21:
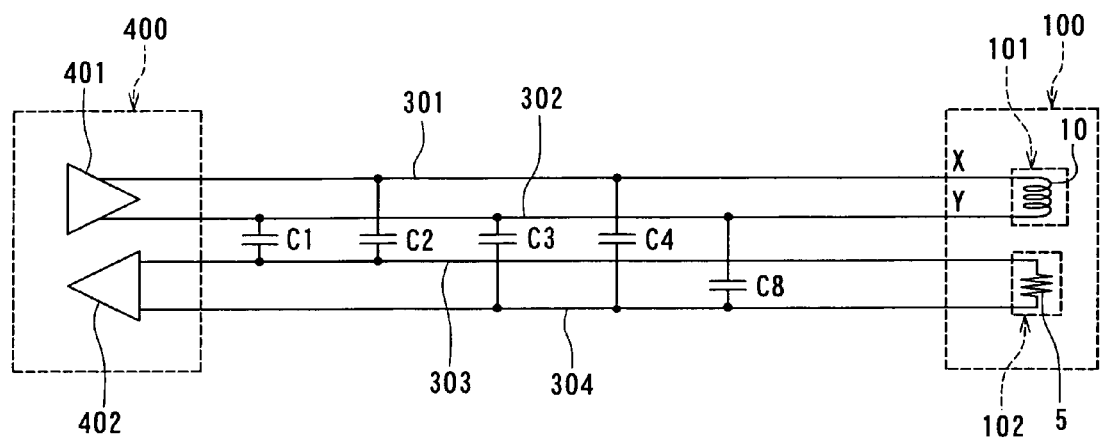
FIG. 21 is a schematic diagram illustrating lines of a magnetic head slider supporting apparatus of a third embodiment of the invention, a thin-film magnetic head element and a read/write processing circuit.
Figure 22:
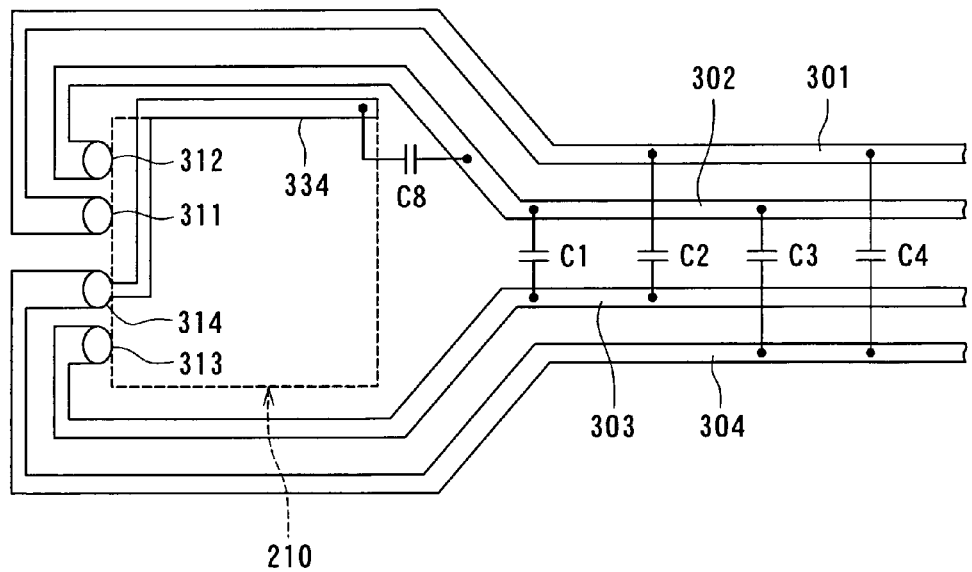
FIG. 22 is a view for schematically illustrating the positional relationship of the lines of the third embodiment of the invention.

A third embodiment of the invention will now be described. The third embodiment is applied to a case in which voltages of substantially symmetric waveforms are applied to the lines 301 and 302 as write signals. FIG. 21 is a schematic diagram illustrating the lines 301 to 304 of a magnetic head slider supporting apparatus of the third embodiment, the thin-film magnetic head element 100 and the read/write processing circuit 400. FIG. 22 is a view for schematically illustrating the positional relationship of the lines 301 to 304. In the third embodiment, as shown in FIG. 21, a conductor 334 is provided in place of the conductors 331 and 332 of the first embodiment. The conductor 334 is incorporated in the flexible wiring board 300. The conductor 334 is connected to the line 304 through the terminal 314 and disposed adjacent to the line 302 with a space. The conductor 334 thereby generates a parasitic capacitance between the lines 302 and 304. This parasitic capacitance is provided for reducing a potential difference created between the lines 303 and 304 due to the write signals transmitted through the lines 301 and 302.

In the third embodiment an equation $C8=(C1-C2)-(C3-C4)$ holds, where C1 is the parasitic capacitance between the lines 302 and 303, C2 is the parasitic capacitance between the lines 301 and 303, C3 is the parasitic capacitance between the lines 302 and 304 excluding the parasitic capacitance created by the conductor 334, C4 is the parasitic capacitance between the lines 301 and 304, and C8 is the parasitic capacitance created by the conductor 334. The remainder of configuration of the third embodiment is the same as that of the first embodiment.

In the third embodiment, voltages of substantially symmetric waveforms are applied to the lines 301 and 302 as write signals. In this case, the voltage induced on the line 303 in response to changes in voltages on the lines 301 and 302 depends on $C1-C2$. On the other hand, the voltage induced on the line 304 in response to changes in voltages on the lines 301 and 302 depends on $(C3+C8)-C4$. In the third embodiment, since the equation $C8=(C1-C2)-(C3-C4)$ holds as described above, an equation $C1-C2=(C3+C8)-C4$ holds. Therefore, the voltage induced on the line 303 and the voltage induced on the line 304 are of nearly equal values. That is, the potential difference created between the lines 303 and 304 due to changes in voltages applied to the lines 301 and 302 is nearly zero. Therefore, according to the embodiment, it is possible to greatly reduce the crosstalk between the lines 301, 302 connected to the write element 101 and the lines 303, 304 connected to the read element 102.

The foregoing description relates to the case in which the equation $C8=(C1-C2)-(C3-C4)$ holds. However, as long as the parasitic capacitance C8 falls within a range of $0<C8<2\{(C1-C2)-(C3-C4)\}$, it is possible to make crosstalk smaller, compared with a case in which the parasitic capacitance C8 does not exist. Within this range, the closer the parasitic capacitance C8 to $(C1-C2)-(C3-C4)$, the smaller is the crosstalk.

The remainder of operations and effects of the third embodiment are similar to those of the first embodiment.

The present invention is not limited to the foregoing embodiments but may be practiced in still other ways. For example, the lines and conductors of the invention may be integrated with the flexure of the suspension.

The pattern of the conductors of each of the embodiments is given as an example. It is possible to provide any other pattern as long as the pattern is capable of producing parasitic capacitances that satisfy the condition of each of the embodiments.

In the foregoing embodiments, the thin-film magnetic head element is disclosed, comprising the read element formed on the base body and the write element stacked on the read element. Alternatively, the read element may be stacked on the write element.

Obviously many modifications and variations of the present invention are possible in the light of the above teachings. It is therefore to be understood that within the scope of the appended claims the invention may be practiced otherwise than as specifically described.

What is claimed is:

1. A magnetic head slider supporting apparatus comprising:
- a suspension flexibly supporting a magnetic head slider incorporating a write element and a read element, such that the slider faces toward a recording medium;
- a first line and a second line that are connected to the write element and transmit write signals to be applied to the write element;
- a third line and a fourth line that are connected to the read element and transmit read signals outputted from the read element; and
- a conductor electrically connected to the third line, the conductor generating a parasitic capacitance for reducing a potential difference created between the third and fourth lines due to the write signals transmitted through the first and second lines, wherein:
- the suspension incorporates a plate-spring-shaped load beam;
- the first to fourth lines include portions disposed along the load beam;
- the portions of the first to fourth lines disposed along the load beam are located side by side in the order of the first line, the second line, the third line and the fourth line;
- the conductor is disposed adjacent to the first line with a space, and generates a parasitic capacitance between the first and third lines; and
- the first line is sandwiched between the second line and the conductor.

2. The magnetic head slider supporting apparatus according to claim 1, wherein an equation $C7=(C1-C2)-(C3-C4)$ holds, where:
- $C1$ is a parasitic capacitance between the second and third lines;
- $C2$ is a parasitic capacitance between the first and third lines excluding the parasitic capacitance generated by the conductor;
- $C3$ is a parasitic capacitance between the second and fourth lines;
- $C4$ is a parasitic capacitance between the first and fourth lines; and
- $C7$ is the parasitic capacitance generated by the conductor.

3. A head gimbal assembly comprising:
the magnetic head slider supporting apparatus according to claim 1.

4. A head arm assembly comprising:
- the magnetic head slider supporting apparatus according to claim 1; and
- an arm for moving the magnetic head slider across tracks of the recording medium, wherein the suspension is attached to the arm.

5. A magnetic disk drive comprising:
- the magnetic head slider supporting apparatus according to claim 1;
- an alignment device for moving the supporting apparatus and thereby aligning the magnetic head slider with respect to the recording medium; and
- a read/write processing circuit, wherein
- the read/write processing circuit applies the write signals to the write element through the first and second lines and receives the read signals from the read element through the third and fourth lines.

6. The magnetic disk drive according to claim 5, wherein the read/write processing circuit applies voltages of substantially symmetric waveforms as the write signals to the first and second lines.

* * * * *